United States Patent
Kudela et al.

(10) Patent No.: US 10,531,552 B2
(45) Date of Patent: Jan. 7, 2020

(54) DEVICE FOR GENERATING AN ATMOSPHERIC-PRESSURE PLASMA

(71) Applicant: EPCOS AG, München (DE)

(72) Inventors: Pavol Kudela, Deutschlandsberg (AT); Franz Rinner, Deutschlandsberg (AT); Markus Puff, Graz (AT)

(73) Assignee: EPCOS AG, München (DE)

( * ) Notice: Subject to any disclaimer, the term of this patent is extended or adjusted under 35 U.S.C. 154(b) by 0 days.

(21) Appl. No.: 16/077,414

(22) PCT Filed: Feb. 7, 2017

(86) PCT No.: PCT/EP2017/052615
§ 371 (c)(1),
(2) Date: Aug. 10, 2018

(87) PCT Pub. No.: WO2017/140531
PCT Pub. Date: Aug. 24, 2017

(65) Prior Publication Data
US 2019/0053366 A1 Feb. 14, 2019

(30) Foreign Application Priority Data
Feb. 15, 2016 (DE) .................. 10 2016 102 585

(51) Int. Cl.
*H01L 41/107* (2006.01)
*H05H 1/24* (2006.01)
*H01L 41/04* (2006.01)

(52) U.S. Cl.
CPC .......... *H05H 1/2475* (2013.01); *H01L 41/044* (2013.01); *H01L 41/107* (2013.01); *H05H 2001/2481* (2013.01)

(58) Field of Classification Search
CPC .......... H05H 1/2475; H05H 2001/2481; H01L 41/044; H01L 41/107
See application file for complete search history.

(56) References Cited

U.S. PATENT DOCUMENTS 5,929,554 A * 7/1999 Kanayama ............ H01L 41/107
310/359
7,245,062 B2 7/2007 Schmidt
(Continued)

FOREIGN PATENT DOCUMENTS

DE 202008008980 U1 9/2008
DE 102010055266 A1 6/2012
(Continued)

*Primary Examiner* — Douglas W Owens
*Assistant Examiner* — Jianzi Chen
(74) *Attorney, Agent, or Firm* — Slater Matsil, LLP

(57) ABSTRACT

A device for generating an atmospheric-pressure plasma is disclosed. In an embodiment the device includes a piezoelectric transformer comprising an input region and an output region, wherein the input region is designed to convert an applied alternating voltage into a mechanical oscillation, wherein the output region is designed to convert a mechanical oscillation into a voltage, and wherein the output region adjoins the input region in a longitudinal direction, a contact element fastened to the piezoelectric transformer, the contact element being designed to apply the alternating voltage to the input region and a holder, wherein the contact element is connected to the holder by a form-fit connection, in such a manner that a movement of the piezoelectric transformer in the longitudinal direction, relative to the holder, is prevented.

21 Claims, 9 Drawing Sheets

(56) References Cited

U.S. PATENT DOCUMENTS

| | | |
|---|---|---|
| 2008/0224570 A1 | 9/2008 | Florian et al. |
| 2012/0126041 A1 | 5/2012 | Nunomura et al. |
| 2015/0373824 A1 | 12/2015 | Nettesheim et al. |
| 2017/0208675 A1 | 7/2017 | Doellgast et al. |

FOREIGN PATENT DOCUMENTS

| | | |
|---|---|---|
| DE | 102013100617 A1 | 7/2014 |
| DE | 102014110405 A1 | 1/2016 |
| EP | 2141968 A2 | 1/2010 |
| JP | H0936451 A | 2/1997 |
| JP | 9307151 A | 11/1997 |
| JP | H11251654 A | 9/1999 |
| JP | 2002026414 A | 1/2002 |
| JP | 2004128264 A | 4/2004 |
| JP | 2009503877 A | 1/2009 |
| JP | 2009130311 A | 6/2009 |
| WO | 03096521 A2 | 11/2003 |

\* cited by examiner

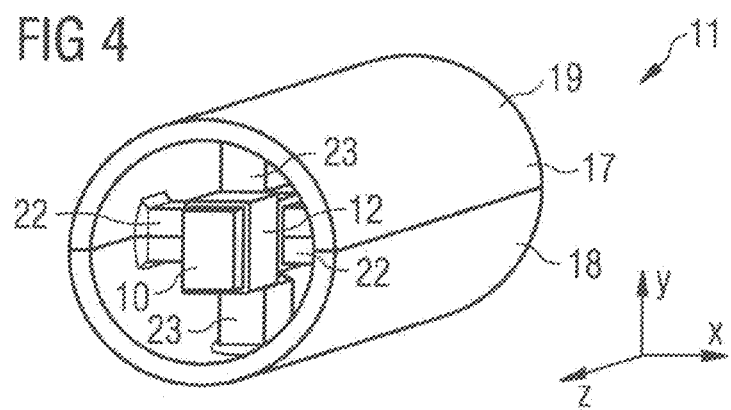
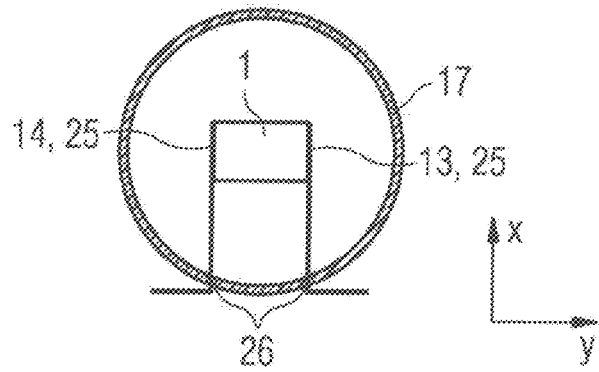

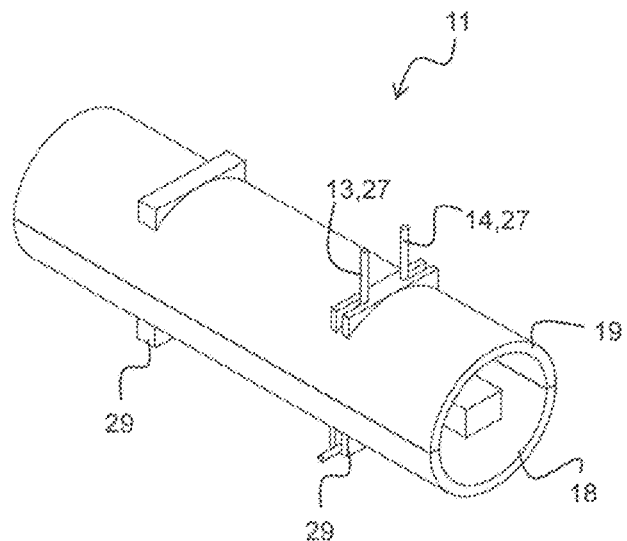
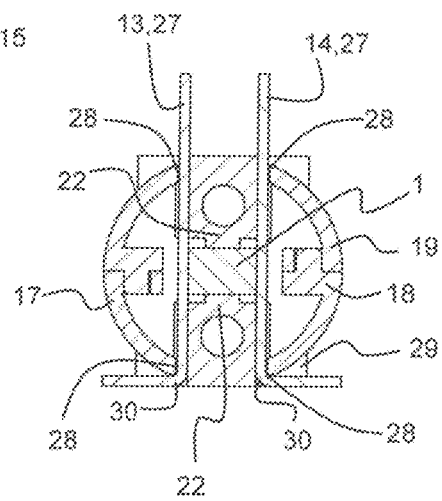

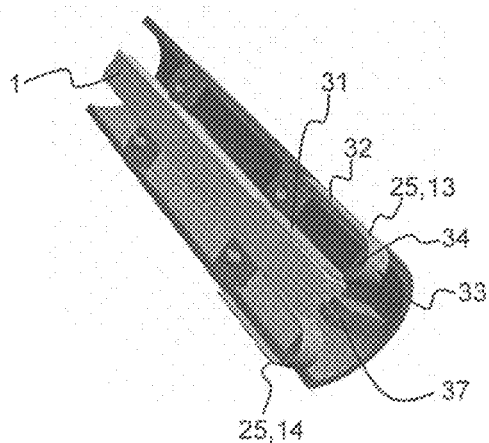
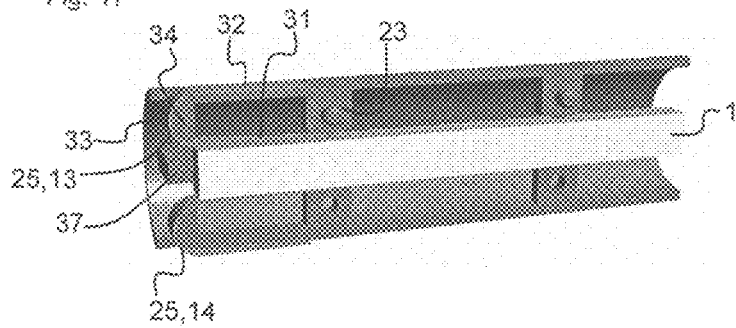
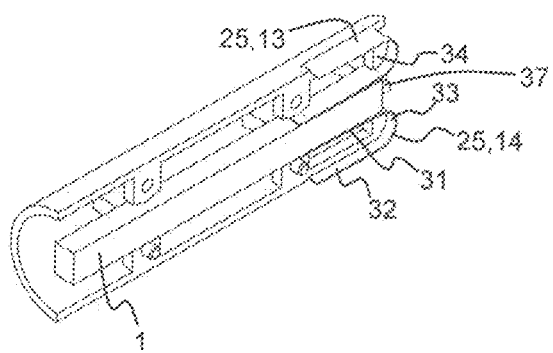

DEVICE FOR GENERATING AN ATMOSPHERIC-PRESSURE PLASMA

This patent application is a national phase filing under section 371 of PCT/EP2017/052615, filed Feb. 7, 2017, which claims the priority of German patent application 10 2016 102 585.2, filed Feb. 15, 2016, each of which is incorporated herein by reference in its entirety.

TECHNICAL FIELD

The present invention relates to a device for generating an atmospheric-pressure plasma. The plasma in this case is a non-thermal plasma.

SUMMARY OF THE INVENTION

Embodiments provide a device that has a piezoelectric transformer, which generates an output voltage that can be used for ionization of a process gas. Further embodiments provide a device that should avoid movements of the piezoelectric transformer, in particular in the longitudinal direction, relative to a holder of the device. At the same time, however, the holder should not adversely affect the piezoelectric transformer in such a manner that oscillations of the transformer are damped, since the efficiency of the plasma generation would be reduced as a result.

Embodiments provide a device that as fully as possible fulfils these initially contradictory requirements.

Embodiments provide a device for generating an atmospheric-pressure plasma, which has a piezoelectric transformer, a contact element and a holder. The piezoelectric transformer has an input region and an output region, wherein the input region is designed to convert an applied alternating voltage into a mechanical oscillation, wherein the output region is designed to convert a mechanical oscillation into a voltage, and wherein the output region adjoins the input region in a longitudinal direction. The contact element is fastened to the piezoelectric transformer and is designed to apply an alternating voltage to the input region. In addition, the contact element is connected to the holder by a form-fit connection, in such a manner that a movement of the piezoelectric transformer in the longitudinal direction, relative to the holder, is prevented.

A connection of at least two connection partners that is produced as a result of the at least two connection partners engaging in one another may be referred to as a "form-fit connection." The connection partners in this case cannot separate from each other, even if there is no transmission of force, or if transmission of force is interrupted. In other words, in the case of a form-fit connection, a movement of one connection partner is blocked in at least one direction by the other connection partner. In the case of operating load, pressure forces act normally, i.e., at right angles, to the surfaces of the connection partners. In the present case, the contact element and the holder form the connection partners of the form-fit connection, a movement of the contact element in the longitudinal direction being blocked by the shape of the holder.

A movement of the piezoelectric transformer in the longitudinal direction is not prevented as a result of the holder being directly connected to the piezoelectric transformer, but as a result of the holder being connected to the contact element, which in turn is fastened to the transformer. A device is thereby created in which the mechanical fastening of the contact element to the piezoelectric transformer is subjected only to slight mechanical loads. Thus, for example, the service life of solder points, at which the contact element is soldered to the outer electrodes, is prolonged considerably.

Moreover, the holder thus does not damp the oscillations of the piezoelectric transformer in the longitudinal direction, since the holder does not act directly upon the piezoelectric transformer. Accordingly, plasma can be produced in a highly efficient manner.

The form-fit connection may be, in particular, impact resistant, such that, for example, even dropping of the device would not result in a longitudinal movement of the piezoelectric transformer relative to the holder.

The holder can thus serve several purposes simultaneously. Owing to its form-fit connection to the contact element, it can fix the piezoelectric transformer in its longitudinal position. At the same time, it is constructed such that the vibrations of the piezoelectric transformer are not damped, or at least are only minimally damped, since the fixing by means of the form-fit to the contact element does not significantly adversely affect these vibrations of the transformer. In addition, the holder can also serve to mechanically protect the transformer, for example, against impacts.

The holder may have two projections, wherein on both sides the contact element bears directly against respectively one of the two projections in the longitudinal direction. Accordingly, the contact element can be enclosed in a form-fitting manner between the two projections.

Alternatively or in addition, the holder may have slot-type recesses in which the contact element is arranged, and through which the contact element is run out from the holder, from an interior of the holder. A form-fit connection between the contact element and the holder may also be created by arranging the contact elements in the slot-type recesses of the holder. The slot-type recesses may extend in the longitudinal direction. In the spatial directions perpendicular to the longitudinal direction, the slot-type recesses may have a significantly lesser extent than in the longitudinal direction.

Alternatively or additionally, the contact element may have two wires, wherein the holder has openings, the diameter of which corresponds to a diameter of the wires, wherein each of the two wires goes through respectively two openings in the holder and is thereby connected to the holder in a form-fitting manner. The diameter of the openings may, in particular, be slightly greater than the diameter of the wires, such that a form-fit is obtained when a wire is arranged in the opening.

The contact element may be fastened to the piezoelectric transformer by a non-separable fastening. A non-separable fastening in this case may refer to all fastenings that cannot be separated without thereby destroying, or at least damaging, at least one of the elements that are fastened together.

Such a non-separable fastening of the contact element to the piezoelectric transformer may be produced, for example, by soldering, bonding, adhesive bonding, or microsilver sintering. In the case of microsilver sintering, a paste is applied between the contact element and the transformer, and the contact element and the transformer are then sintered to each other. Formed from the paste in the sintering process is a layer that is composed of at least 95 weight % silver and that mechanically connects the contact element and the piezoelectric transformer to each other.

The holder may have at least two support elements, on which the piezoelectric transformer is supported and which prevent a movement of the piezoelectric transformer in a direction perpendicular to the longitudinal direction. Movements in this case are movements of the piezoelectric transformer relative to the holder.

In particular, the holder may have a first pair consisting of two support elements, and a second pair consisting of two support elements, the first pair preventing a movement of the transformer, relative to the holder, in a first direction perpendicular to the longitudinal direction, and the second pair preventing a movement of the transformer, relative to the holder, in a second direction that is perpendicular to the longitudinal direction and perpendicular to the first direction.

The support elements can accordingly prevent movements of the piezoelectric transformer in directions perpendicular to the longitudinal direction, without the fastenings of the contact element to the piezoelectric transformer, for example, the solder points, being thereby mechanically loaded. Such movements perpendicular to the longitudinal direction may be triggered, for example, as a result of impacts.

The transformer may be supported on the support elements, such that the support elements do not exert a permanent clamping effect upon the transformer, but only exert a force upon the transformer if the latter would otherwise move, relative to the holder, perpendicularly in relation to the longitudinal direction. As a result of being supported on the support elements, the transformer can thus be prevented from moving in a direction perpendicular to the longitudinal direction. Since the support elements do not exert a permanent force upon the transformer, it can be ensured that the support elements do not damp an oscillation of the transformer in the longitudinal direction.

The support elements may be of a shape that tapers in the form of a wedge toward the piezoelectric transformer and bear against the piezoelectric transformer in a virtually linear manner. Accordingly, the support elements bear with only a minimal surface area against the piezoelectric transformer. In this way, damping of the oscillation of the transformer by the support elements can be reduced yet further.

The support elements may be arranged in such a manner that they bear against the piezoelectric transformer, in the longitudinal direction, at a position that corresponds to one quarter or three quarters of the length of the piezoelectric transformer. At these positions, oscillation nodes can be realized when the piezoelectric transformer is operated at its resonant frequency, or with a harmonic component of the resonant frequency. Accordingly, during operation of the device, the piezoelectric transformer moves only minimally at these position. The arrangement of the support elements at these positions can also be instrumental in the support elements not significantly damping the oscillations of the piezoelectric transformer.

The holder may be composed of a material that deforms predominantly elastically. Owing to the predominant elastic deformation, a high quality factor, in particular, can be obtained. In particular, the material may be a hard material. In particular, the support elements may be composed of a material that deforms predominantly elastically. A holder made of rubber or other plastically deforming material would result in damping of the oscillation of the piezoelectric transformer. By use of a material that deforms predominantly elastically, it can be ensured that the oscillations of the transformer cannot be mechanically transmitted to the holder and, accordingly, are not damped.

The material may be, for example, polybutylene terephthalate (PBT), polytetrafluorethylene (PTFE), or a polyamide, which may additionally have glass fiber components.

The holder may have two half-shells that are connected to each other. A fastening of the piezoelectric transformer, or of the contact elements, may be produced in this case by the connection of the two half-shells.

The two half-shells may be identical to one another. Further, the two half-shells may be made from one material. In particular, the two half-shells may have been fabricated by means of injection molding from an injection molding compound, and one and the same mould may be used to fabricate both half-shells. The use of a holder consisting of two identical half-shells can thus render possible a simple production method in which it is necessary to use only one single injection mould.

The contact element may have a metal plate that comprises copper-invar-copper (CIC=Copper-Invar-Copper). Copper-invar-copper has the advantage of a very low coefficient of thermal expansion. Moreover, a metal plate comprising copper-invar-copper can be pressed into differing shapes, and accordingly allows a high degree of design flexibility in the design of the contacting of the device.

The metal plate may have a first portion, which bears against the piezoelectric transformer, and a second portion, which is arranged on an exterior of the holder. For this purpose, the metal plate may be bent. For example, the metal plate may be bent in a U shape. Alternatively, the metal plate may be bent in such a manner that it has right-angled bends that separate the portions from each other.

In addition, the holder may have a guide element, the shape of which matches the shape of the metal plate. For example, the plate and the guide element may each have a semicircular portion. The metal plate and the holder may be arranged in such a manner that a form-fit connection of the metal plate and the holder is produced.

The metal plate may additionally have a middle portion, which connects the first portion to the second portion, wherein the metal plate is bent in a U shape. In particular, the middle portion may realize the semicircular portion of the U shape. The first and the second portion may each form straight limbs of the U shape.

The second portion may have a bent sub-portion, which is connected to the holder in a form-fitting manner. This form-fit connection may be additionally instrumental in precluding relative movements between the metal plate and the holder.

The device may additionally have a web that bears against an input-side end face of the piezoelectric transformer and thereby prevents a movement of the piezoelectric transformer in the longitudinal direction toward the web. For example, together with the metal plate the web may realize a form-fit connection between the holder, the contact element and the transformer.

A further aspect of the present invention relates to a plasma generator, having the device described above, and having a housing, in which the device is arranged. The plasma generator may render possible, in particular, the generation of a non-thermal atmospheric-pressure plasma. The plasma generator may have further structural elements, besides the device and the housing. These include, for example, a trigger circuit, a nozzle, via which the plasma can emerge, and an inlet for the process gas.

The housing may be an outer housing of the plasma generator. The holder of the device may be arranged inside the housing. Accordingly, the holder can then only be accessed when the housing is open.

The device may preferably be separably fastened in the housing, such that the device can be removed from the housing. In particular, the device has the elements of the plasma generator that particularly frequently exhibit signs of wear. This applies in particular to the piezoelectric transformer, which during operation continuously executes mechanical oscillations, by which it can be damaged in the case of long-term operation. Also in the case of long-term operation of the piezoelectric transformer, damage may be caused by the plasma ignitions on the output side.

In particular, the plasma generator may be designed in such a manner that the piezoelectric transformer can only be removed together with the holder and the contact element from the plasma generator. In this case, the piezoelectric transformer, the holder and the contact element can be removed as a unit from the plasma generator, and replaced. This makes it possible to create a device that has the above-mentioned advantages such as, for example, impact-resistant mounting of the transformer, only minimal damping of the oscillations of the transformer, or longitudinal fixing without loading of the mechanical fastening of the contact elements to the transformer.

If the device is designed in such a manner that it can be taken out of the plasma generator and replaced, then, following replacement of the device, the other structural elements of the plasma generator can continue to be used.

The holder of the device may be fastened in the housing of the plasma generator, for example, by a screwed connection or a latching connection. The connection may be designed in such a manner that it does not separate as a result of impacts and vibrations during operation of the plasma generator, but cannot be separated by a user of the plasma generator.

The device may alternatively be fastened in the housing by a material connection, for example, by adhesive bonding or soldering. Although such a connection cannot be separated, it can nevertheless be advantageous in the case of particular applications that require a particularly high level of fastening stability.

A control circuit, for controlling the piezoelectric transformer, which is electrically contacted to the piezoelectric transformer via the contact element, may be arranged in the housing. If the holder is fastened in the housing, then in this case an electrical contact can be realized between the contact element and the control circuit.

BRIEF DESCRIPTION OF THE DRAWINGS

The present invention is described further in the following on the basis of the figures.

FIG. 4 shows a perspective view of the device;

FIGS. 5 to 10 show a cross section through a device according to alternative exemplary embodiments;

FIGS. 12 to 15 show the device for generating an atmospheric-pressure plasma according to a further exemplary embodiment;

FIGS. 16 to 19 show the device according to a further exemplary embodiment;

DETAILED DESCRIPTION OF ILLUSTRATIVE EMBODIMENTS

Figure 1:
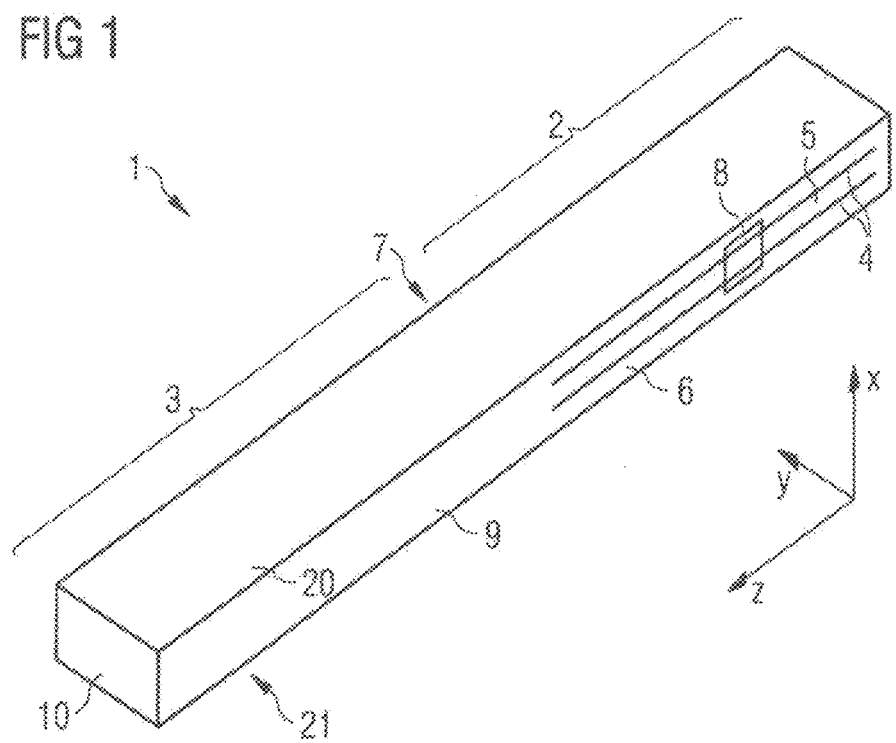
FIG. 1 shows a piezoelectric transformer in a perspective view.

FIG. 1 shows a piezoelectric transformer 1 in a perspective view. The piezoelectric transformer 1 may be used, in particular, in a device for generating non-thermal atmospheric-pressure plasma.

A piezoelectric transformer 1 is a type of resonant transformer that is based on piezo-electricity and that, unlike the conventional magnetic transformers, constitutes an electro-mechanical system. The piezoelectric transformer 1 is, for example, a Rosen-type transformer.

The piezoelectric transformer 1 has an input region 2 and an output region 3, the output region 3 adjoining the input region 2 in a longitudinal direction z. In the input region 2 the piezoelectric transformer 1 has electrodes 4, to which an alternating voltage can be applied. The electrodes 4 extend in the longitudinal direction z of the piezoelectric transformer 1. The electrodes 4 are stacked, alternating with a piezoelectric material 5, in a stacking direction x, which is perpendicular to the longitudinal direction z. The piezoelectric material 5 in this case is polarized in the stacking direction x.

The electrodes 4 are arranged inside the piezoelectric transformer 1, and are also referred to as internal electrodes. The piezoelectric transformer 1 has a first lateral face 6, and a second lateral face 7 that is opposite the first lateral face 6. A first external electrode 8 is arranged on the first lateral face 6. A second external electrode (not shown) is arranged on the second lateral face 7. The internal electrodes 4 are electrically contacted in an alternating manner in the stacking direction x, either to the first external electrode 8 or to the second external electrode.

The piezoelectric transformer 1 additionally has a third lateral face 20 and a fourth lateral face 21, which are opposite each other and which are arranged perpendicularly in relation to the first lateral face 6 and the second lateral face 7. The surface normals of the third and fourth lateral faces 20, 21 each run in the stacking direction x.

The input region 2 can be controlled with a small alternating voltage, which is applied between the electrodes 4. Owing to the piezoelectric effect, the alternating voltage applied on the input side in first converted into a mechanical oscillation. The frequency of the mechanical oscillation in this case depends substantially on the geometry and the mechanical structure of the piezoelectric transformer 1.

The output region 3 comprises piezoelectric material 9, and does not have internal electrodes. The piezoelectric material 9 in the output region is polarized in the longitudinal direction z. The piezoelectric material 9 of the output region 3 may be the same material as the piezoelectric material 5 of the input region 2, and the piezoelectric materials 5 and 9 may differ in their direction of polarization. In the output region 3, the piezoelectric material 9 is shaped to form a single, monolithic layer, which is polarized entirely in the longitudinal direction z. In this case, the piezoelectric material 9 in the output region 3 has only a single direction of polarization.

If there is an alternating voltage applied to the electrodes 4 in the input region 2, a mechanical wave, which generates an output voltage in the output region 3 as a result of the piezoelectric effect, is realized within the piezoelectric material 5, 9. The output region 3 has an output-side end face 10. Thus, in the output region 3, a voltage is generated between the end face 10 and the end of the electrodes of the input region 2. A high voltage is generated in this case at the output-side end face 10. Also produced in this case, between the output-side end face and an area around the piezoelectric transformer, is a high potential difference that is sufficient to generate a strong electric field, which ionizes a process gas.

In this way, the piezoelectric transformer 1 generates strong electric fields that are capable of ionizing gases or liquids by electrical excitation. In this case, atoms or molecules of the respective gas or of the respective liquid are ionized, and form a plasma. Ionization occurs whenever the electrical field strength at the surface of the piezoelectric transformer 1 exceeds the ignition field strength of the plasma. Ignition field strength of a plasma refers to the field strength that is required to ionize the atoms or molecules.

Figure 2:
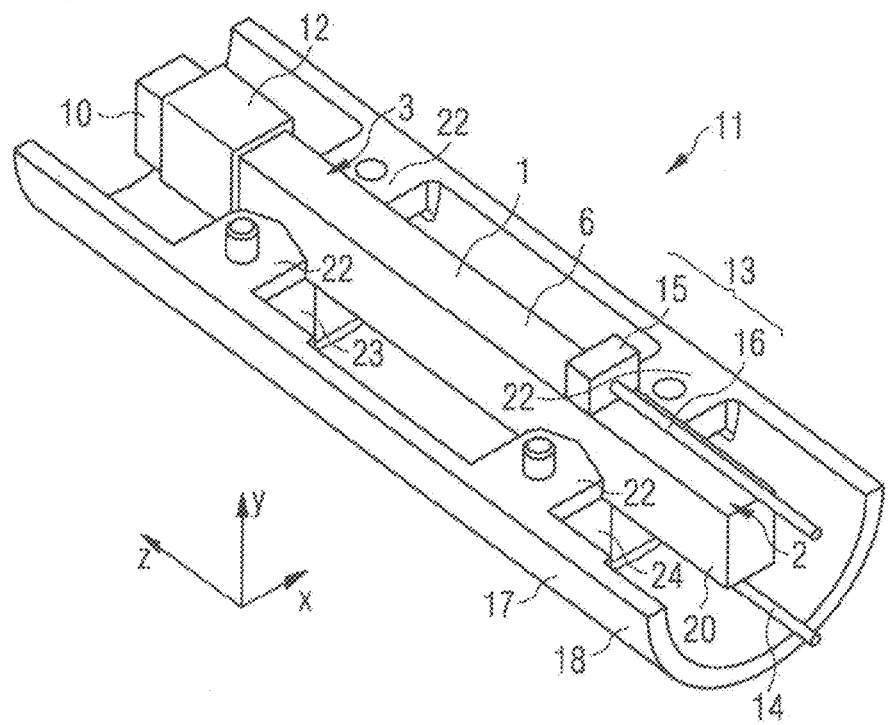
FIG. 2 shows a device or generating an atmospheric-pressure plasma.

FIG. 2 shows a device 11 for generating an atmospheric-pressure plasma. The device 11 comprises the piezoelectric transformer 1 shown in FIG. 1. Here, the piezoelectric transformer 1 additionally has an insulation 12, which is arranged in the output region 3 of the piezoelectric transformer 1, the insulation 12 at least partially covering the lateral faces of the transformer 1 in the output region 3, and the output-side end face 10 being without insulation 12. The insulation may be formed, for example, by a shrink-on sleeve. The insulation 12 prevents unwanted plasma ignitions from occurring along the output-side edges of the piezoelectric transformer 1.

The device additionally has a first contact element 13 and a second contact element 14. The first contact element 13 is connected to the first external electrode 8 of the piezoelectric transformer 1. The second contact element 14 is connected to the second external electrode of the piezoelectric transformer 1. Via the first and the second contact element 13, 14, an alternating voltage can be applied to the first and the second external electrode of the piezoelectric transformer 1.

The contact elements 13, 14 each have a wire 15, arranged at the end of which there is a block 16. The block 16 of the contact elements 13, 14 is fastened to the respective external electrode 8 by a non-separable fastening. For example, the block 16 may be fastened to the external electrode 8 of the piezoelectric transformer 1 by soldering, bonding, adhesive-bonding or microsilver sintering. The block 16 and the wire 15 comprise a conductive material, for example, copper.

The device 11 additionally has a holder 17. The holder 17 may have two half-shells 18, 19. In FIG. 2, only one first half-shell 18 of the holder 17 is shown, to enable the connection of the piezoelectric transformer 1 to the holder 17 to be shown. The second half-shell 19 may be identical to the half-shell 18 shown in FIG. 2. The half-shells 18, 19 have injection-molded elements.

The holder 17 has support elements 22. The third and the fourth lateral face 20, 21 of the piezoelectric transformer 1 each bear against one of the support elements 22. The support elements 22 are each tapered in the form of a wedge toward the piezoelectric transformer 1, such that they bear in a virtually linear manner against the piezoelectric transformer 1. The support elements 22 in this case are arranged, along the longitudinal direction z, at the positions at which oscillation nodes are realized when the piezoelectric transformer 1 is operated at its resonant frequency, or with a harmonic components. Accordingly, the support elements 22 are arranged at a length of one quarter of the length of the piezoelectric transformer 1 and at three quarters of the length of the piezoelectric transformer 1.

Owing to the arrangement of the support elements 22 at the oscillation nodes of the piezoelectric transformer 1, and owing to their wedge-shaped design, the effect is achieved that the support elements 22 only minimally damp a movement of the piezoelectric transformer 1 in the longitudinal direction.

In the stacking direction x, on both sides the piezoelectric transformer 1 bears directly against respectively one of the two support elements 22. The support elements 22 are opposite one another in the stacking direction x. In this way, movements of the piezoelectric transformer 1, relative to the holder 17, in the stacking direction x are prevented.

The holder 17 additionally has further support elements 23, between which the piezoelectric transformer 1 is enclosed in a y direction, the y direction being perpendicular to the stacking direction x and perpendicular to the longitudinal direction z. In the y direction, the piezoelectric transformer 1 can bear directly against a respective support element 23. The support elements 23 are opposite one another in the y direction. These support elements 23 likewise taper in the form of a wedge toward the piezoelectric transformer 1, and bear against the latter in a virtually linear manner. As a result of bearing against the support elements 23, a movement of the piezoelectric transformer 1, relative to the holder 17, in the y direction is prevented.

Figure 3:
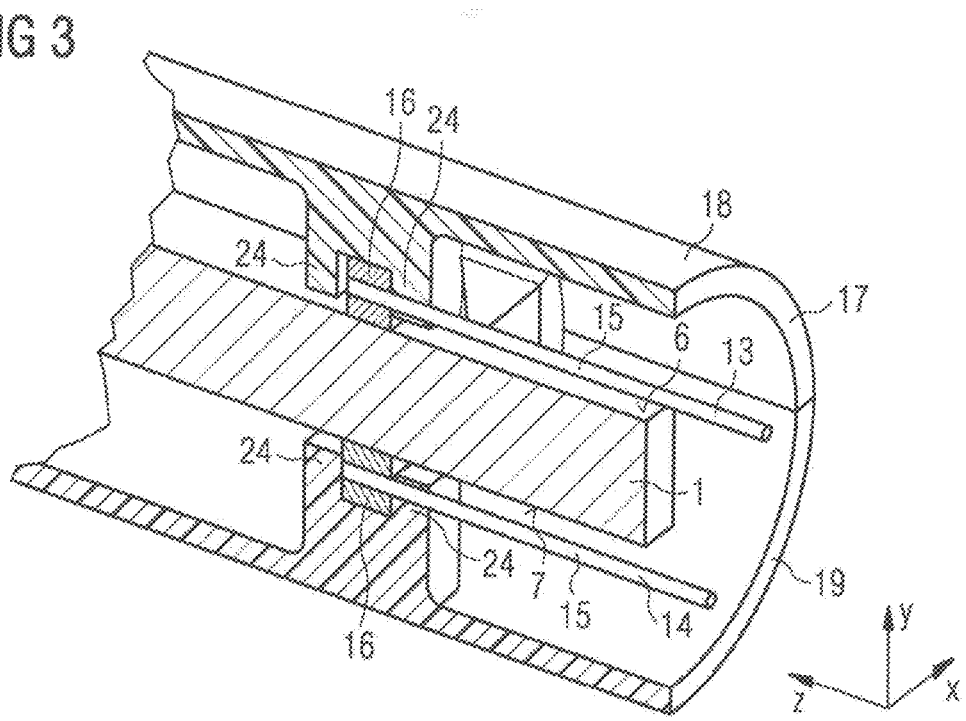
FIG. 3 shows a detail of a cross section through the device shown in FIG. 2.
Figure 6:
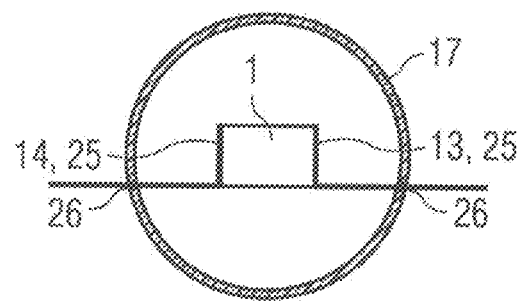
Figure 7:
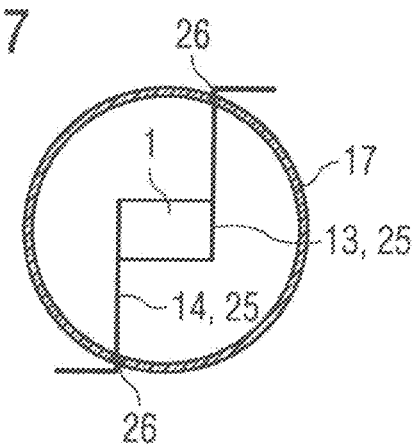
Figure 8:
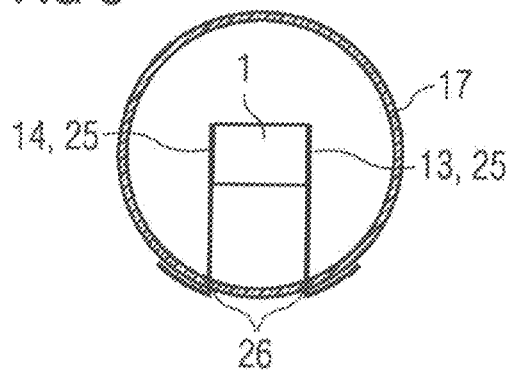
Figure 9:
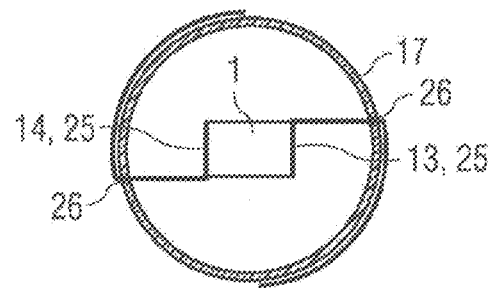
Figure 10:
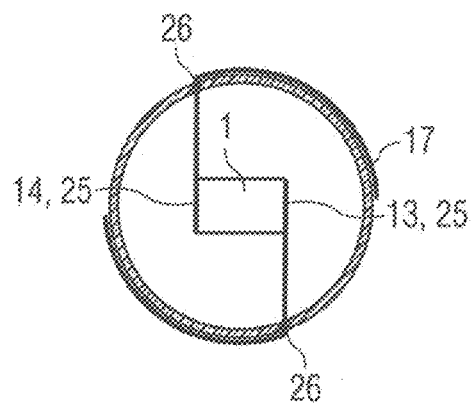

FIG. 3 shows a detail of a cross section through the device 11 for generating an atmospheric-pressure plasma. FIG. 3 shows the first half-shell 18 and the second half-shell 19 of the holder 17. It can be seen that each of the half-shells 18, 19 has projections 24, the block 16 of the contact element 13, 14 being arranged, in the longitudinal direction z, between two projections 24. In the longitudinal direction z, the contact elements 13, 14 in this case each bear against both a first projection 24 and a second projection 24. Accordingly, a movement of the contact elements 13, 14 in the longitudinal direction z, relative to the holder 17, is prevented. A form-fit connection of the contact elements 13, 14 to the holder 17 is realized. Since the contact elements are fixedly connected to the respective external electrode 8 of the piezoelectric transformer 1, a movement of the piezoelectric transformer 1 in the longitudinal direction z, relative to the holder 17, is also not possible.

During operation, the piezoelectric transformer 1 executes oscillations in the longitudinal direction z. Owing to the form-fit connection of the contact elements 13, 14 to the holder 17, it is ensured that the transformer 1 is not moved relative to the holder 17 by this oscillation. The form-fit connection is additionally impact-resistant, such that the piezoelectric transformer 1 is not moved relative to the holder 17 even if the device 11 is subjected to an impact, for example, as a result of being dropped.

Owing to the wedge shape of the support elements 22, 23, movements of the piezoelectric transformer 1, relative to the holder 17, in directions x, y perpendicular to the longitudinal direction z are avoided, without mechanical loading of the fastening of the contact elements 13, 14 to the piezoelectric transformer 1. This fastening may be, for example, solder points. Instead, mechanical loading occurs at the points of connection of the contact elements 13, 14 to the holder 17. It is thereby ensured that the piezoelectric transformer 1 itself is not destroyed by the mechanical loads, and that the electrical contacting of the piezoelectric transformer 1 is not disturbed.

The two half-shells 18, 19 of the holder 18 may be identical. The two half-shells 18, 19 are additionally fastened to each other in such a manner that they cannot be non-destructively separated from each other. For example, the two half-shells 18, 19 may be adhesive-bonded to each other.

FIG. 4 shows a perspective view of the device 11. The output region 3 of the piezoelectric transformer 1 can be seen in FIG. 4. Also shown in FIG. 4 are the support elements 22, 23, which are arranged at a longitudinal length of three quarters of the piezoelectric transformer 1. Two support elements 22 prevent a movement of the piezoelectric transformer 1, relative to the holder 17, in the stacking direction x, and two support elements 23 prevent a movement of the piezoelectric transformer 1, relative to the holder 17, in the y direction.

The device 11 may be used, in particular, in a plasma generator. The holder 17 in this case may be fastened in a housing of the plasma generator. The device 11 is designed in such a manner that the device 11 can be taken back out of the plasma generator, and can be replaced by another device 11 of the same type. Accordingly, the device 11 can be separably fastened in the housing of the generator, for example, by means of a screwed connection or a latching connection.

The plasma generator has further elements besides the device 11, for example, a control circuit. The piezoelectric transformer 1 may be electrically contacted to the control circuit via the contact elements 13, 14. The control circuit in this case may apply an alternating voltage to the input region 2 of the piezoelectric transformer 1 via the contact elements 13, 14.

In a plasma generator, the piezoelectric transformer 1 in particular is a component part that may exhibit signs of wear and that, accordingly, should advantageously be replaceable. The device 11 enables the piezoelectric transformer 1 to be replaced in the plasma generator, together with the holder 17 and the contact elements 13, 14, without the necessity of also replacing further structural elements of the plasma generator. At the same time, the device 11 allows the piezoelectric transformer 1 to be held in a defined position without significantly impairing it in its operation, in particular without substantially damping the oscillations of the piezoelectric transformer 1.

FIGS. 5 to 10 show a cross section through a device 11 according to alternative exemplary embodiments. The contact elements 13, 14 in this case are formed by a metal plate 25 comprising copper-invar-copper. The contact elements 13, 14 are fixedly fastened to the external electrodes of the piezoelectric transformer 1, for example, by soldering, bonding, adhesive bonding or microsilver sintering.

The holder 17 has slot-type recesses 26. The contact elements 13, 14 are arranged in the recesses 26. The contact elements 13, 14 are run out from the interior of the holder 17 into the exterior of the holder 17 through the recesses 26. The contact elements 13, 14 are fastened in a form-fit manner in the recesses 26. Movements of the contact elements 13, 14, relative to the holder 17, in the longitudinal direction x are thereby avoided. In addition, the contact elements 13, 14 may be adhesive-bonded to the holder 17 at the recesses 26, in order to achieve a more stable fastening.

FIGS. 5 to 10 show differing shapes of the contact elements 13, 14. The contact elements 13, 14 in this case are each fastened over a surface area to the respective external electrode 8 of the piezoelectric transformer 1.

Figure 11:
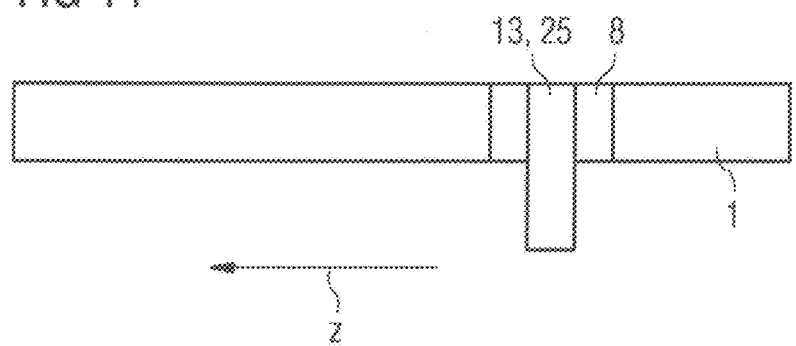
FIG. 11 shows a side view of a piezoelectric transformer and a contact element.

FIG. 11 shows a side view of the piezoelectric transformer 1 and of a contact element 13. Here, likewise, it can be seen that the contact element 13 is connected over a surface area to the external electrode 8 of the piezoelectric transformer 1. It can thereby be ensured that the fastening of the contact element 13 to the external electrode 8 is stable.

Figure 12:
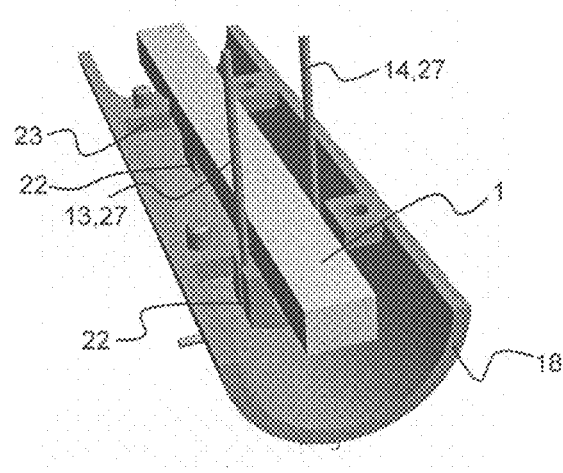
Figure 13:
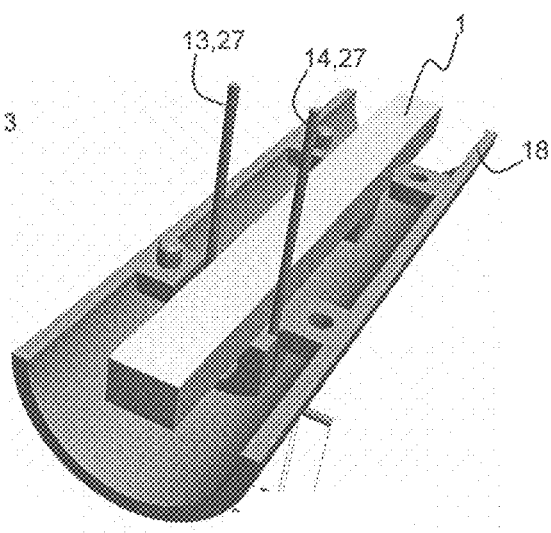

FIGS. 12 to 15 show the device 11 according to a further exemplary embodiment. FIG. 12 and FIG. 13 each show a perspective view of the device 11, but the second half-shell 19 of the holder 17 are not shown, in order that the elements arranged inside the holder 17 can be represented. FIG. 14 shows a perspective representation of the device 11, with the second half-shell 19 also being shown. FIG. 15 shows a cross section through the device 11 shown in FIG. 14.

Here, the contact elements 13, 14 are formed by two wires 27. The holder 17 has four openings 28. There are two openings 28 arranged in the first half-shell 18. Likewise, there are two openings 28 arranged in the second half-shell 19. Each of the two wires 27 runs through an opening 28 in the first half-shell 18 and an opening 28 in the second half-shell 19. The diameter of the openings 28 is matched to the diameter of the wires 27, such that the wires 27 are connected to the holder 17 in a form-fitting manner. The wires 27 have a linear course inside the holder 17.

In addition, the wires 27 are soldered to the piezoelectric transformer 1. In particular, one of the wires 27 is soldered to the first external electrode 8 of the piezoelectric transformer 1, and the other of the wires 27 is soldered to the second exterior electrode. Owing to the form-fit between the wires 27 and the holder 17, and the soldering of the wires 27 to the piezoelectric transformer 1, the piezoelectric transformer 1 cannot move relative to the holder 17 in the longitudinal direction z. Moreover, owing to the form-fit of the wires with the holder 17, and the soldering of the wires 27 to the transformer 1, a movement of the transformer 1 in the y direction, relative to the holder 17, is prevented in the input region 2.

The holder 17 additionally has support elements 22, on which the piezoelectric transformer 1 is supported, and which prevent a movement of the piezoelectric transformer 1, relative to the holder 17, in the stacking direction x, and support elements 23, which prevent a movement of the piezoelectric transformer 1 in the y direction. Two support elements 22 are arranged in the input region 2 of the transformer 1 at a length of one quarter of the length of the piezoelectric transformer 1. The third and the fourth lateral face 20, 21 of the transformer 1 bear against the support elements 22. Further support elements 22, 23 are arranged in the output region 3 of the transformer 1, at a length of three quarters of the transformer 1. Here, the first lateral face 6, the second lateral face 7, the third lateral face 20 and the fourth lateral face 21 are each supported on a support element 22, 23.

In addition, the holder has projections 29 on its exterior. These serve for surface mounting of the device 11 (SMD=Surface Mounted Device). The wires 27 that come out of the openings 28 in the first half-shell 18 each have a 90° bend 30 outside the holder 17. This bent shape of the wires 27 likewise serves to enable surface mounting of the device 11.

Figure 19:
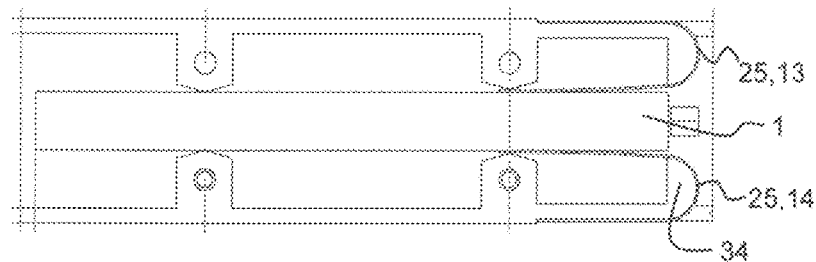

FIGS. 16 to 19 show the device 11 according to a further exemplary embodiment. FIGS. 16, 17 and 18 each show a perspective view of the device 11, but the second half-shell 19 of the holder 17 is not shown, so that the elements arranged inside the holder 17 can be shown. FIG. 19 shows a cross section through the device 11 shown in FIGS. 16 to 18.

In this exemplary embodiment, the contact element 13, 14 has a metal plate 25. The metal plate 25 is composed of a copper layer, an invar layer and a further copper layer, arranged over one another in this sequence.

The metal plate 25 is in the shape of a U. The metal plate 25 has a first portion 31 and a second portion 32, which are connected to each other via a middle semicircular portion 33. The first portion 31 of the metal plate 24 bears against the input region 2 of the piezoelectric transformer 1. The first portion 31 may be fixedly connected to the piezoelectric transformer 1, for example, by a soldered connection, a bond connection, an adhesive connection or a sintered connection with microsilver.

The holder 17 additionally has a guide element 34, which defines the arrangement of the metal plate 25. The guide element 34 has a semicircular portion, against which there bears the middle semicircular portion 33 of the metal plate 25.

The holder 17 additionally has a continuous web 37, which prevents the transformer 1 from moving out along the longitudinal direction z, in the direction of the input region 2, relative to the holder 17. The web 37 bears against an input-side end face of the transformer 1, the input-side end face facing away from the output region 3 of the transformer 1.

In addition, the second portion 32 of the metal plate 25 is arranged on the exterior of the holder 17. In the region in which the metal plate 25 is arranged, the holder 17 has an outer diameter that is slightly less than the outer diameter in the other regions of the holder 17.

Owing to the web 37, which prevents the transformer 1 from moving out in the longitudinal direction, in the direction of the input region 2, and owing to the U shape of the metal plate 25, which bears against the semicircular guide element 34 of the holder 17 and the exterior of the holder, which is additionally connected to the piezoelectric transformer 1, a form-fit is produced. Movements of the piezoelectric transformer 1 in the longitudinal direction z, relative to the holder 17, are thereby also prevented.

By means of a plug connection or a screwed connection, the device 11 can now be inserted, or screwed, into a socket, the socket having electrical contacts that electrically contact the metal plate 25.

The holder 17 additionally has support elements 22, 23, which are arranged in the inlet region 2 at a length of one quarter of the length of the transformer 1, and in the outlet region 3 at a length of three quarters of the length of the transformer 1. Each of the lateral faces 6, 7, 20, 21 of the transformer 1 bears respectively against one support element 22, 23.

Figure 20:
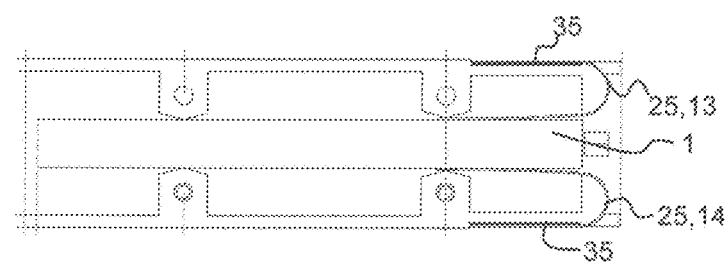
FIG. 20 shows a cross section through the device according to an alternative variant of the exemplary embodiment shown in FIGS. 16 to 19.

FIG. 20 shows a cross section through the device 11 according to an alternative variant of the exemplary embodiment shown in FIGS. 16 to 19. In the case of the alternative variant, additionally applied to the exterior of the holder 17 there is an adhesive layer 35, which bonds the second portion 32 of the metal plate 25 to the holder 17.

Figure 21:
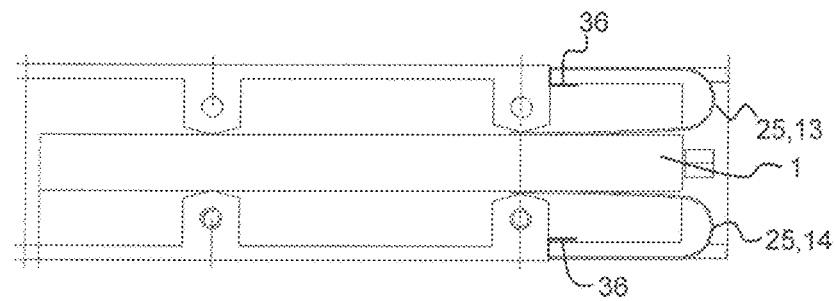
FIG. 21 shows a cross section through the device according to a further exemplary embodiment.

FIG. 21 shows a cross section through the device 11 according to a further exemplary embodiment. The exemplary embodiment shown in FIG. 21 differs from the exemplary embodiment shown in FIGS. 16 to 19 in that the second portion 32 of the metal plate 25 additionally has a bent sub-portion 36. In particular, the bent sub-portion 36 has two bends at which the metal plate 25 is bent by an angle of 90° in each case. Owing to the bent sub-portion 36, an additional form-fit connection is obtained between the holder 17 and the metal plate 25. The additional form-fit connection is additionally instrumental in precluding movements of the piezoelectric transformer 1 in the longitudinal direction z, relative to the holder 17.

Figure 22:
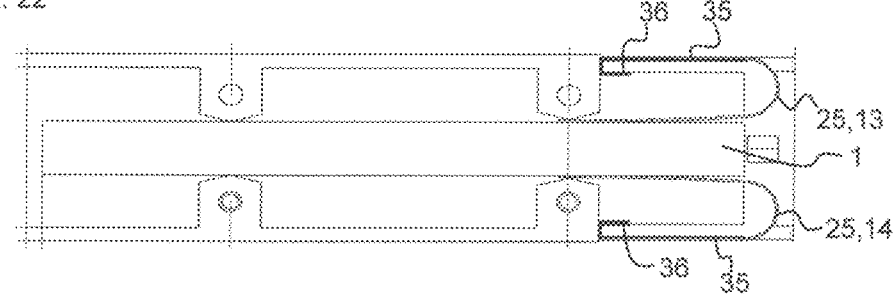
FIG. 22 shows an alternative variant of the exemplary embodiment shown in FIG. 21.

FIG. 22 shows an alternative variant of the exemplary embodiment shown in FIG. 21. In the case of the alternative variant, there is additionally applied, on the exterior of the holder 17, an adhesive layer 35 that bonds the second portion 32 of the metal plate 25 to the holder 17. In addition, the adhesive layer 35 is also applied on the region of the holder 17 against which there bears the bent sub-portion 36.

According to a further embodiment, the embodiment variants of FIGS. 16 to 19 that are shown in FIGS. 21 and 22 may also be realized with the omission of the web 37 on the input side of the holder 17.

The invention claimed is:

1. A device for generating an atmospheric-pressure plasma, the device comprising:
   a piezoelectric transformer comprising an input region and an output region, wherein the input region is designed to convert an applied alternating voltage into a mechanical oscillation, wherein the output region is designed to convert a mechanical oscillation into a voltage, and wherein the output region adjoins the input region in a longitudinal direction;
   a contact element fastened to the piezoelectric transformer, the contact element being designed to apply the alternating voltage to the input region, wherein the contact element has two wires; and
   a holder, wherein the contact element is connected to the holder by a form-fit connection, in such a manner that a movement of the piezoelectric transformer in the longitudinal direction, relative to the holder, is prevented, wherein the holder has openings, a diameter of which corresponds to a diameter of the wires and wherein each of the two wires goes through two respective openings in the holder and are thereby connected to the holder in a form-fitting manner.

2. The device as claimed in claim 1, wherein the holder has two projections, and wherein, on both sides, the contact element bears directly against respectively one of the two projections in the longitudinal direction.

3. The device as claimed in claim 1, wherein the holder has slot-type recesses in which the contact element is arranged, and through which the contact element is run out from the holder, from an interior of the holder.

4. The device as claimed in claim 1, wherein the contact element is fastened to the piezoelectric transformer by a non-separable fastening.

5. The device as claimed in claim 1, wherein the holder has at least two support elements, on which the piezoelectric transformer is supported and which prevent a movement of the piezoelectric transformer in a direction perpendicular to the longitudinal direction.

6. The device as claimed in claim 5, wherein the support elements are of a shape that tapers in the form of a wedge toward the piezoelectric transformer and bear against the piezoelectric transformer in a virtually linear manner.

7. The device as claimed in claim 5,
   wherein the support elements are arranged in such a manner that they bear against the piezoelectric transformer, in the longitudinal direction, at a position that corresponds to one quarter of a length of the piezoelectric transformer, and/or
   wherein the support elements are arranged in such a manner that they bear against the piezoelectric transformer, in the longitudinal direction, at a position that corresponds to three quarters of the length of the piezoelectric transformer.

8. The device as claimed in claim 1, wherein the holder is composed of a material that deforms predominantly elastically.

9. The device as claimed in claim 1, wherein the holder has two half-shells that are connected to each other.

10. The device as claimed in claim 9, wherein the two half-shells are identical, and wherein the two half-shells are made from one material.

11. A plasma generator comprising:
a device as claimed in claim 1; and
a housing in which the device is arranged.

12. The plasma generator as claimed in claim 11, wherein the device is separably fastened in the housing, such that the device can be removed from the housing.

13. The plasma generator as claimed in claim 11, wherein the holder is fastened in the housing by a screwed connection or a latching connection.

14. The plasma generator as claimed in claim 11, wherein the device is fastened in the housing by a material connection.

15. The plasma generator as claimed claim 11, wherein a trigger circuit, for triggering the piezoelectric transformer, which is electrically contacted to the piezoelectric transformer via the contact element, is arranged in the housing.

16. A device for generating an atmospheric-pressure plasma, the device comprising:
a piezoelectric transformer comprising an input region and an output region, wherein the input region is designed to convert an applied alternating voltage into a mechanical oscillation, wherein the output region is designed to convert a mechanical oscillation into a voltage, and wherein the output region adjoins the input region in a longitudinal direction;
a contact element fastened to the piezoelectric transformer, the contact element being designed to apply the alternating voltage to the input region, wherein the contact element has a metal plate that comprises copper-invar-copper; and
a holder, wherein the contact element is connected to the holder by a form-fit connection, in such a manner that a movement of the piezoelectric transformer in the longitudinal direction, relative to the holder, is prevented.

17. The device as claimed in claim 16, wherein the metal plate has a first portion, which bears against the piezoelectric transformer, and a second portion, which is arranged on an exterior of the holder.

18. The device as claimed in claim 17, wherein the metal plate comprises additionally a middle portion, which connects the first portion to the second portion, and wherein the metal plate is bent in a U shape.

19. The device as claimed in claim 17, wherein the second portion has a bent sub-portion, which is connected to the holder in a form-fitting manner.

20. The device as claimed in claim 17, wherein the device additionally has a web that bears against an input-side end face of the piezoelectric transformer and thereby prevents a movement of the piezoelectric transformer in the longitudinal direction toward the web.

21. A device for generating an atmospheric-pressure plasma, the device comprising:
a piezoelectric transformer comprising an input region and an output region, wherein the input region is designed to convert an applied alternating voltage into a mechanical oscillation, wherein the output region is designed to convert a mechanical oscillation into a voltage, and wherein the output region adjoins the input region in a longitudinal direction;
a contact element fastened to the piezoelectric transformer, the contact element being designed to apply the alternating voltage to the input region; and
a holder, wherein the contact element is connected to the holder by a form-fit connection, in such a manner that a movement of the piezoelectric transformer in the longitudinal direction, relative to the holder, is prevented, and wherein the holder has two identical half-shells that are connected to each other, the two half-shells being made from one material.

* * * * *